(12) United States Patent
Kagawa (10) Patent No.: US 10,580,889 B2
(45) Date of Patent: Mar. 3, 2020

(54) SEMICONDUCTOR DEVICE AND METHOD OF MANUFACTURING THEREOF, AND POWER CONVERSION APPARATUS

(71) Applicant: Mitsubishi Electric Corporation, Tokyo (JP)

(72) Inventor: Yasuhiro Kagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/233,493

(22) Filed: Dec. 27, 2018

(65) Prior Publication Data

US 2019/0259872 A1 Aug. 22, 2019

(30) Foreign Application Priority Data

Feb. 21, 2018 (JP) ................. 2018-028435

(51) Int. Cl.
| | |
|---|---|
| H01L 29/423 | (2006.01) |
| H01L 29/78 | (2006.01) |
| H01L 29/16 | (2006.01) |
| H01L 29/66 | (2006.01) |
| H01L 21/265 | (2006.01) |
| H01L 21/266 | (2006.01) |
| H02M 7/5387 | (2007.01) |

(52) U.S. Cl.
CPC ........ *H01L 29/7813* (2013.01); *H01L 21/266* (2013.01); *H01L 21/26506* (2013.01); *H01L 29/1608* (2013.01); *H01L 29/4236* (2013.01); *H01L 29/66068* (2013.01); *H02M 7/53875* (2013.01)

(58) Field of Classification Search
CPC .... H01L 21/70; H01L 21/702; H01L 21/8232
See application file for complete search history.

(56) References Cited

U.S. PATENT DOCUMENTS

| | | | |
|---|---|---|---|
| 2010/0224932 A1 | 9/2010 | Takaya et al. | |
| 2011/0018005 A1* | 1/2011 | Nakano | H01L 21/046 257/77 |

FOREIGN PATENT DOCUMENTS

| | | |
|---|---|---|
| JP | 2001-267570 A | 9/2001 |
| JP | 2005-142243 A | 6/2005 |
| JP | 2007-242852 A | 9/2007 |

* cited by examiner

*Primary Examiner* — Cheung Lee
(74) *Attorney, Agent, or Firm* — Studebaker & Brackett PC (57) ABSTRACT

A first semiconductor layer of a first conductivity type, a first semiconductor region of a second conductivity type provided in an upper layer part thereof, a second semiconductor region of the first conductivity type provided in the upper layer part thereof, a gate trench penetrating through the first and second semiconductor regions in a thickness direction and a bottom surface thereof reaching inside of the first semiconductor layer, a gate insulating film in the gate trench, a gate electrode embedded in the gate trench, a second semiconductor layer of the second conductivity type provided so as to extend, from the bottom surface of the gate trench, a third semiconductor layer of the second conductivity type extending to a position deeper than the bottom surface of the gate trench, and a fourth semiconductor layer of the first conductivity type interposed between the second semiconductor layer and the third semiconductor layer in the position deeper than the bottom surface of the gate trench.

8 Claims, 8 Drawing Sheets

SEMICONDUCTOR DEVICE AND METHOD OF MANUFACTURING THEREOF, AND POWER CONVERSION APPARATUS

BACKGROUND OF THE INVENTION

Field of the Invention

The present invention relates to a semiconductor device, and more particularly to a semiconductor device including a trench gate.

Description of the Background Art

In a trench gate type semiconductor device using silicon (Si), an avalanche electric field strength of a semiconductor layer is lower than a breakdown electric field strength of a gate insulating film, therefore, the breakdown voltage of the semiconductor device is determined by the avalanche electric field strength of the semiconductor layer. Meanwhile, the avalanche electric field strength of silicon carbide (SiC) is about ten times that of Si, therefore, in the semiconductor device (silicon carbide semiconductor device) using silicon carbide, the avalanche electric field strength of the semiconductor layer (SiC) and the breakdown electric field strength of the gate insulating film become equal. In the trench gate type semiconductor device, when a voltage is applied to the semiconductor device, electric field concentration occurs at the corner portion of the lower part of the trench, therefore, in the silicon carbide semiconductor device, dielectric breakdown occurs first from the gate insulating film in the trench corner portion. Therefore, in the trench gate type silicon carbide semiconductor device, the breakdown voltage is limited by the electric field strength of the gate insulating film. Therefore, in the conventional trench gate type silicon carbide semiconductor device, as disclosed in, for example, Japanese Patent Application Laid-Open No. 2001-267570, in the case of the n-channel type, it has been proposed to provide a protective diffusion layer in which the p-type impurities are implanted at a high concentration in the drift layer below the trench. Also, in the conventional trench gate type semiconductor device, it is known that a plurality of trenches are provided and a protective diffusion layer is provided under the respective trenches, as disclosed in Japanese Patent Application Laid-Open No. 2007-242852. Accordingly, by providing the protective diffusion layer under the trench in this manner, electric field concentration in the trench corner portion is relaxed and the breakdown voltage can be improved.

As described above, in a case where the protective diffusion layer is provided under the trench, a depletion layer is formed in the drift layer between the protective diffusion layers provided between adjacent trenches, and a Junction Field Effect Transistor (JFET) region is formed by this depletion layer. The JFET region acts as a resistor of which resistance is determined by the width of the depletion layer extending from the protective diffusion layer and the trench spacing. That is, the resistance of the JFET region increases as the trench spacing becomes narrow (pitch narrowing), which increases the on-resistance and causes the device characteristics to deteriorate.

In view of the above problem, for example, in the trench gate type silicon carbide semiconductor device disclosed in Japanese Patent Application Laid-Open No. 2005-142243, a floating p-type diffusion layer is formed on the side wall of the central portion of the trench, and when a low voltage is applied (during ON state), the p-type diffusion layer at the bottom of the trench is floated, and constriction due to the depletion layer is suppressed to suppress the JFET resistance. Meanwhile, a structure has been proposed in which a depletion layer extending between the respective p-type diffusion layers is brought into contact at the time of application of a high voltage (during OFF state), so that the same potential is obtained by so-called punch-through so as to relax the electric field at the bottom of the trench. However, in the structure in which the p-type diffusion layer is disposed in the upper portion, the potential of the upper p-type diffusion layer differs from the potential of the p-type diffusion layer at the bottom of the trench, therefore, the punch-through potential becomes too large and a problem is raised that the protective effect of the gate insulating film is lowered. Also, after the depletion layer reaches the p-type diffusion layer at the side wall of the central portion of the trench and reaches the p-type diffusion layer at the bottom of the trench, therefore, depending on the distance between a body region and the p-type diffusion layer, the potential takes time to be fixed, which may result in insufficient improvement in switching characteristics and so forth.

SUMMARY

In a trench gate type semiconductor device including a protective diffusion layer for protecting a gate insulating film at the bottom of a gate trench, a semiconductor device configured to suppress the JFET resistance during ON state and protect a gate insulating film at the bottom of the gate trench during OFF state is provided.

A semiconductor device according to the present invention includes a first semiconductor layer of a first conductivity type, a first semiconductor region of a second conductivity type provided in an upper layer part of the first semiconductor layer, a second semiconductor region of the first conductivity type provided in the upper layer part of the first semiconductor layer, a gate trench provided so as to penetrate through the first and second semiconductor regions in a thickness direction and a bottom surface thereof reaching inside of the first semiconductor layer, a gate insulating film covering an inner wall surface of the gate trench, a gate electrode embedded in the gate trench, a second semiconductor layer of the second conductivity type provided so as to extend, from the bottom surface of the gate trench, in a thickness direction of the first semiconductor layer, a third semiconductor layer of the second conductivity type extending to a position deeper than the bottom surface of the gate trench, and a fourth semiconductor layer of the first conductivity type interposed between the second semiconductor layer and the third semiconductor layer in the position deeper than the bottom surface of the gate trench.

According to the semiconductor device described above, the potential of the protective diffusion layer during On state is set to floating and the potential of the protective diffusion layer during OFF state is grounded, therefore, the JFET resistance is suppressed during On state and the gate insulating film at the bottom of the gate trench during OFF state is protected.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Hereinafter, Embodiments of the present invention will be described with reference to the accompanying drawings. It should be noted that the term "MOS" has indicated a junction structure of metal, oxide, and semiconductor for a long time, and is the abbreviation of Metal-Oxide-Semiconductor. However, in a field effect transistor having a MOS structure (hereinafter referred to simply as "MOS transistor"), in particular, materials of gate insulating films and gate electrodes are improved in view of integration thereof of recent years, improvements in the production process, and so forth.

For example, in a MOS transistor, in view of mainly forming a source-drain in a self-aligning manner, polycrystalline silicon has been employed as a material of the gate electrode, instead of metal. Also, in view of improving electric characteristics, a material of a high dielectric constant is employed as a material of the gate insulating film, however, the material is not necessarily limited to oxide.

Accordingly, the term "MOS" is employed but not necessarily limited only to the lamination structure of metal-oxide-semiconductor, and therefore, such limitation is not assumed also in the present specification. That is, in view of the common general technical knowledge, the term "MOS" here includes not only the meaning of the abbreviation stemming from the origin of the term, but also broadly includes the meaning of the lamination structure of conductor-insulator-semiconductor.

Further, in the following description, with respect to a conductivity type for impurities, the n-type is generally defined as a first conductivity type, and the p-type is generally defined as a second conductivity type, the definitions may be inverted.

Embodiment 1

<Device Configuration>

Figure 1:
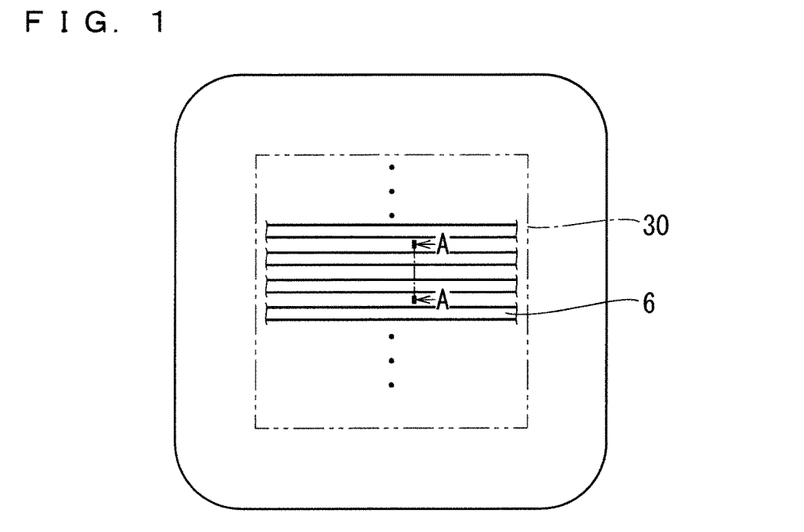
FIG. 1 is a plan view schematically illustrating an example of a top surface configuration of the entire semiconductor device according to the present invention.

FIG. 1 is a plan view schematically illustrating an example of a top surface configuration of the entire semiconductor device according to the present invention. As illustrated in FIG. 1, an active region 30 in which a plurality of minimum unit structures (MOSFET cells) of a MOSFET called "unit cell" are arranged is provided in the center part of the quadrangular outer shape. In the active region 30, a plurality of gate trenches 6 are provided one another in parallel with a space therebetween. It should be noted that, the plurality of gate trenches 6 are connected to the gate wiring provided in the active region 30 and the gate wiring is connected to the gate pad, the illustration and description thereof will be omitted.

Figure 2:
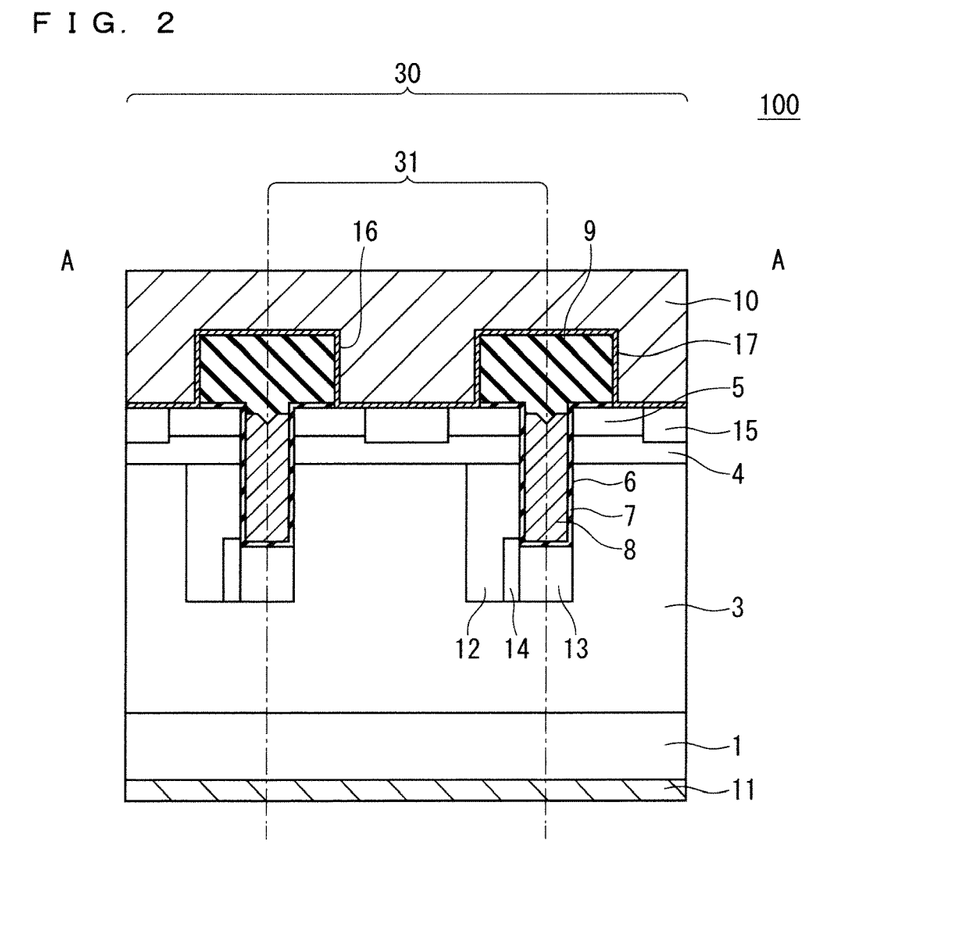
FIG. 2 is a cross-sectional view illustrating a configuration of the semiconductor device of Embodiment 1 according to the present invention.

FIG. 2 is a cross-sectional view illustrating a configuration of characteristic parts of a semiconductor device according to Embodiment 1 of the present invention, more specifically, a trench gate type MOSFET 100 formed on a silicon carbide semiconductor substrate (SiC substrate), and corresponds to the sectional view taken along the line A-A in FIG. 1 as seen in the direction of the arrows.

As illustrated in FIG. 2, in the MOSFET 100 of Embodiment 1, two adjacent gate trenches 6 and respective impurity regions provided therebetween constitute one unit cell 31.

As illustrated in FIG. 2, the MOSFET 100 of Embodiment 1 includes an epitaxial layer 3 (first semiconductor layer) of the first conductivity type provided on one main surface (first main surface) of a silicon carbide semiconductor substrate 1 of a first conductivity type (n-type), a well region 4 (first semiconductor region) of the second conductivity type (p-type) provided on the epitaxial layer 3, a source region 5 (second semiconductor region) of the first conductivity type selectively provided in an upper layer portion of the well region 4, and a well contact region 15 of the second conductivity type. It should be noted that, the epitaxial layer 3 can be functionally referred to as a drift layer. And, under the bottom surface of the gate trench 6 penetrating through the source region 5 and the well region 4 from the uppermost surface of the source region 5 in the thickness direction and reaching the inside of the epitaxial layer 3, a protective diffusion layer 13 (second semiconductor layer) of the second conductivity type reaching a position deeper than the bottom surface, a second conductivity type well connection layer 12 (third semiconductor layer) is provided so as to be in contact with one side surface of the gate trench 6, and the upper end thereof is connected to the well region 4, and the lower end thereof extends to a position deeper than the bottom surface of the gate trench 6 and is located at the same depth as the bottom surface of the protective diffusion layer 13, for example.

The well connection layer 12 has a step in a portion parallel with the protective diffusion layer 13 in the lower layer portion thereof, and an isolation diffusion layer 14 (fourth semiconductor layer) of the first conductivity type is provided in the step portion. In other words, the isolation diffusion layer 14 is interposed between the side surface of the protective diffusion layer 13, which is on the same side as the one side surface of the gate trench 6 and the well connection layer 12. The isolation diffusion layer 14 extends along the side surface of the protective diffusion layer 13, and the structure is that the well connection layer 12 and the protective diffusion layer 13 are not in direct contact with each other. It should be noted that, the isolation diffusion layer 14 has a width (the length in the arrangement direction of the gate trenches 6) that is substantially constant and at least covers the entire side surface of the protective diffusion layer 13.

The upper end of the isolation diffusion layer 14 extends to a position shallower than the bottom surface of the gate trench 6 and the lower end of the isolation diffusion layer 14 extends to a position equivalent to the bottom surfaces of the protective diffusion layer 13 and the isolation diffusion layer 14. It should be noted that, the position of the upper end of the isolation diffusion layer 14 is not limited to the above and may be the same position as the bottom surface of the gate trench 6, and the position of the lower end of the isolation diffusion layer 14 is not limited to the above and may extend to a position deeper than the bottom surfaces of the protective diffusion layer 13 and the isolation diffusion layer 14.

The inner wall of the gate trench 6 is covered with the gate insulating film 7, and a gate electrode 8 is embedded in the region surrounded by the gate insulating film 7. An interlayer insulating film 9 is provided so as to cover the gate trench 6 and the periphery thereof, and a source contact 16 (contact opening) is formed between the gate trenches 6 not covered with the interlayer insulating film 9. Then, the surface of the interlayer insulating film 9 and the surface of the substrate between the interlayer insulating films 9 are covered with a silicide film 17, the source electrode 10 (first main electrode) is provided on the silicide film 17, the source contact 16 is embedded with the source electrode 10 and the well contact region 15 under the bottom surface of the source contact 16 is electrically connected to the source electrode 10 via the silicide film 17.

A drain electrode 11 (second main electrode) is provided on the other main surface (second main surface) of the silicon carbide semiconductor substrate 1 on the side opposite to the source electrode 10 side.

Here, the silicon carbide semiconductor substrate 1 has, for example, a polytype of 4H, and the main surface of the silicon carbide semiconductor substrate 1 and the main surface of the epitaxial layer 3 are (0001) surfaces having an off angle θ. The off angle θ may be, for example, 10° or less.

<Operation>

Figure 3:
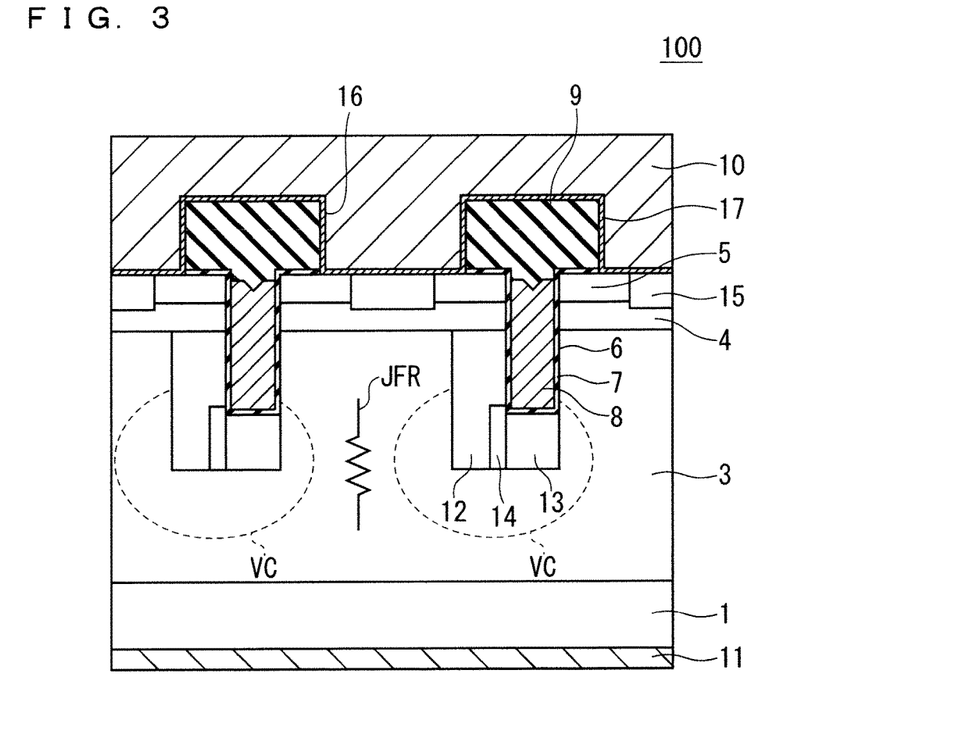
FIG. 3 and FIG. 4 are diagrams illustrating an operation of the semiconductor device of Embodiment 1 according to the present invention.

Next, the operation of the MOSFET 100 according to Embodiment 1 of the present invention will be described with reference to FIGS. 3 and 4. FIG. 3 is a diagram schematically illustrating a depletion layer VC extending from the well connection layer 12 and the protective diffusion layer 13 in the ON state of the MOSFET 100, and the depletion layer VC is indicated by a broken line.

When the MOSFET 100 is in the ON state, a gate voltage is applied to the gate electrode 8 through a gate wiring (not illustrated), and a current flows, so that the potential in the vicinity of the protective diffusion layer 13 becomes approximately several volts (V). At this time, in order to prevent the depletion layer extending from the protective diffusion layer 13 and the well connection layer 12 from contacting the depletion layer extending from the protective diffusion layer 13 and the well connection layer 12 provided at the adjacent gate trench 6, the concentration of the n-type impurities in the isolation diffusion layer 14 between the protective diffusion layer 13 and the well connection layer 12 is adjusted. Accordingly, the protective diffusion layer 13 is electrically separated from the well connection layer 12 provided at the adjacent gate trench 6, so that the floating state can be maintained.

The protective diffusion layer 13 is in a floating state, therefore, the drain voltage is capacitively divided by the pn junction capacitance between the protective diffusion layer 13 and the isolation diffusion layer 14 and the pn junction capacitance between the well connection layer 12 and the isolation diffusion layer 14, and the potential of the protective diffusion layer 13 becomes lower than the drain voltage, for example, about half of the drain voltage. The capacitance partial pressure is determined by each of the above pn junction capacitances, and each pn junction capacitance is determined by the area ratio of the pn junction, therefore, by adjusting the area ratio of each pn junction, the potential of the protective diffusion layer 13 can be adjusted.

Accordingly, when the MOSFET 100 is in the ON state, the protective diffusion layer 13 maintains the floating state, so that the potential between the protective diffusion layer 13 and the vicinity thereof becomes about half of the drain voltage as compared with the case where the protective diffusion layer 13 is grounded via the well connection layer 12, thereby suppressing the extension of the depletion layer.

As a result, the width of the JFET region formed in the region sandwiched between the depletion layers VC each of which extends from the protective layers 13 and the well connection layers 12 provided at the adjacent gate trenches 6 is widened, and the JFET resistance JFR is lowered, thereby suppressing an increase in on-resistance.

Figure 4:
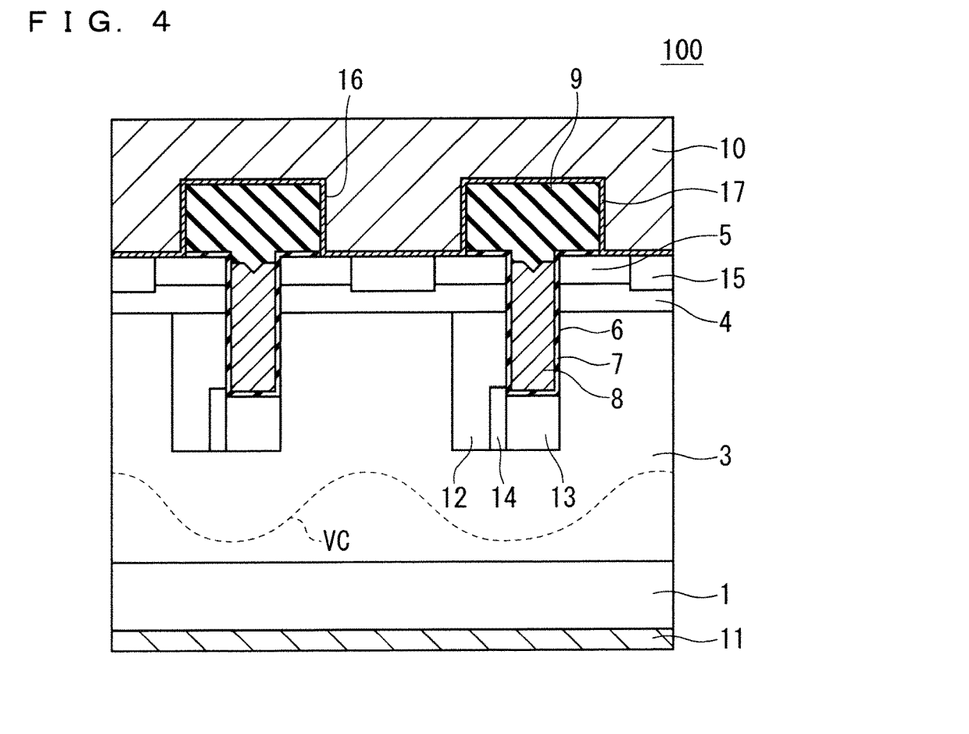

FIG. 4 is a diagram schematically illustrating the depletion layer VC extending from each of the well connection layer 12 and the protective diffusion layer 13 in the OFF state of the MOSFET 100, and the depletion layer VC is indicated by a broken line.

When the gate voltage is no longer applied to the gate electrode 8, the MOSFET 100 is switched from the ON state to the OFF state, the potential in the vicinity of the protective diffusion layer 13 is, for example, about 10 V, therefore, the depletion layers VC extending from each of the protective layer 13 and the well connection layer 12 are in contact, resulting in, so called, punch-through state. At that time, the potential of the protective diffusion layer 13 becomes the same potential as that of the well connection layer 12, that is, the same ground potential as that of the well region 4 by punch-through, and the potential between the protective diffusion layer 13 and vicinity thereof is doubled compared to the case where the protective layer 13 is in the floating state. As a result, the depletion layer for protecting the gate insulating film 7 at the bottom of the gate trench 6 stretches further, so that the electric field applied to the gate insulating film 7 can be relaxed and the gate insulating film 7 can be protected.

Here, in order to punch through the depletion layers VC each of which extend from the protective diffusion layers 13 and the well connection layers 12 provided at the adjacent gate trenches 6 in the OFF state of the MOSFET 100, the concentration of the n-type impurities in the isolation diffusion layer 14 is set to equal to the concentration of the n-type impurities of the epitaxial layer 3 or lower than that of the epitaxial layer 3. By setting the concentration lower than that of the epitaxial layer 3, the depletion layer readily stretches.

The width of the isolation diffusion layer 14 (the length in the arrangement direction of the gate trenches 6) is set to 0.1 to 0.3 μm. By narrowing the width of the isolation diffusion layer 14, the punch through of the depletion layer readily occurs when the MOSFET 100 is off.

It should be noted that, the range of the width of the isolation diffusion layer 14 described above can control the depletion layer VC as described above when the concentration of the n-type impurities of the epitaxial layer 3 is in the range of $5\times10^{15}$ to $2\times10^{16}$ $cm^{-3}$. Therefore, when the concentration of the n-type impurities in the epitaxial layer 3 is outside the range of $5\times10^{15}$ to $2\times10^{16}$ $cm^{-3}$, the width of the isolation diffusion layer 14 also has a value outside the range of 0.1 to 0.3 μm.

<Manufacturing Method>

Hereinafter, a method of manufacturing the MOSFET 100 of Embodiment 1 will be described with reference to FIGS. 5 to 13 which are cross-sectional views illustrating the steps in order.

It should be noted that, in the following, in a case where the concentration of impurities of impurity layers and impurity regions has concentration profile, the impurity concentration (cm$^{-3}$) indicates the peak value of impurity concentration in the impurity layers and impurity regions.

Also, as n-type impurities, nitrogen (N) or phosphorus (P) and as p-type impurities, aluminum (Al) or boron (B) are used.

Figure 5:
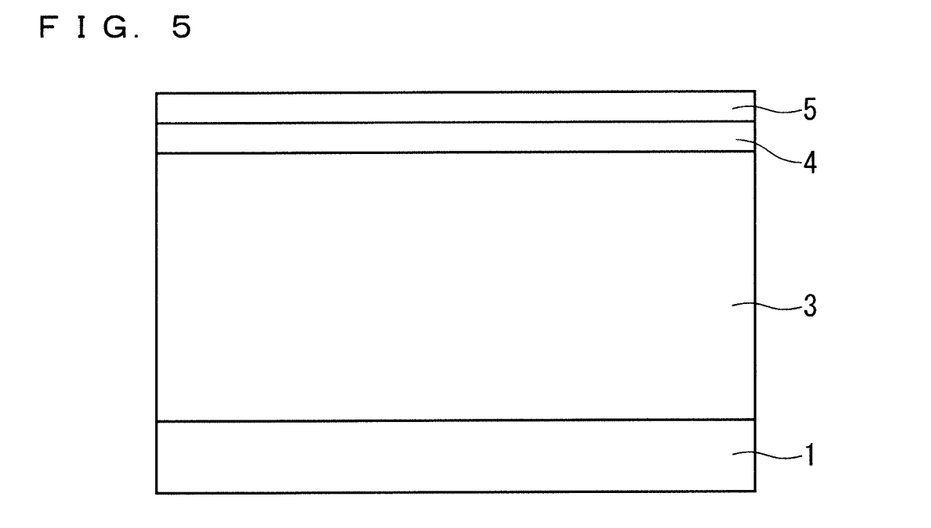
FIG. 5 to FIG. 13 are cross-sectional views illustrating manufacturing processes of the semiconductor device of Embodiment 1 according to the present invention.

First, in the step illustrated in FIG. 5, an n-type impurity is contained at a relatively low concentration (n) on one main surface of an n-type silicon carbide semiconductor substrate 1 in a wafer state having a 411 polytype, and the epitaxial layer 3 of silicon carbide having relatively high resistance is formed by epitaxial growth. At this time, the impurity concentration of the epitaxial layer 3 is formed to be in the range of $5\times10^{15}$ cm$^{-3}$ to $2\times10^{16}$ cm$^{-3}$.

Thereafter, the p-type impurities are ion-implanted from above the epitaxial layer 3 to form a p-type well region 4 in an upper layer portion of the epitaxial layer 3, and thereafter, the n-type impurities are ion-implanted above the p-type well region 4, thereby forming the source region 5, in an upper layer portion of the well region 4, which contains n-type impurity concentration at a relatively high concentration (n$^+$) and is relatively low resistance.

Here, the source region 5 is formed so as to contain impurity concentration in the range of $1\times10^{18}$ cm$^{-3}$ to $1\times10^{20}$ cm$^{-3}$, and the well region 4 is formed so as to contain impurity concentration in the range of $1\times10^{16}$ cm$^{-3}$ to $1\times10^{18}$ cm$^{-3}$.

Figure 6:
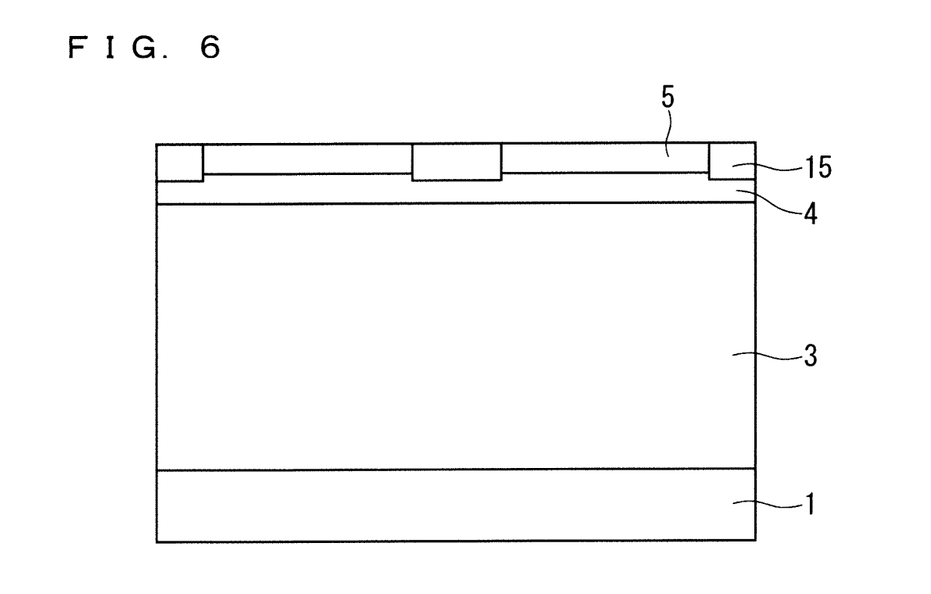

Next, in the step illustrated in FIG. 6, the p-type well contact region 15 is selectively formed in the source region 5 by ion implantation. It should be noted that, the formation position of the well contact region 15 is set according to the formation position of the source contact 16 (FIG. 1) to be formed later.

Here, the well contact region 15 is formed so as to contain impurity concentration in the range of $1\times10^{19}$ cm$^{-3}$ to $1\times10^{21}$ cm$^{-3}$. Also, the thickness of the well contact region 15 is formed to be equal to or greater than the thickness of the source region 5 so that the well contact region 15 securely comes into contact with the well region 4. It should be noted that, the formation order of the well region 4, the source region 5 and the well contact region 15 is not limited to the above.

Figure 7:
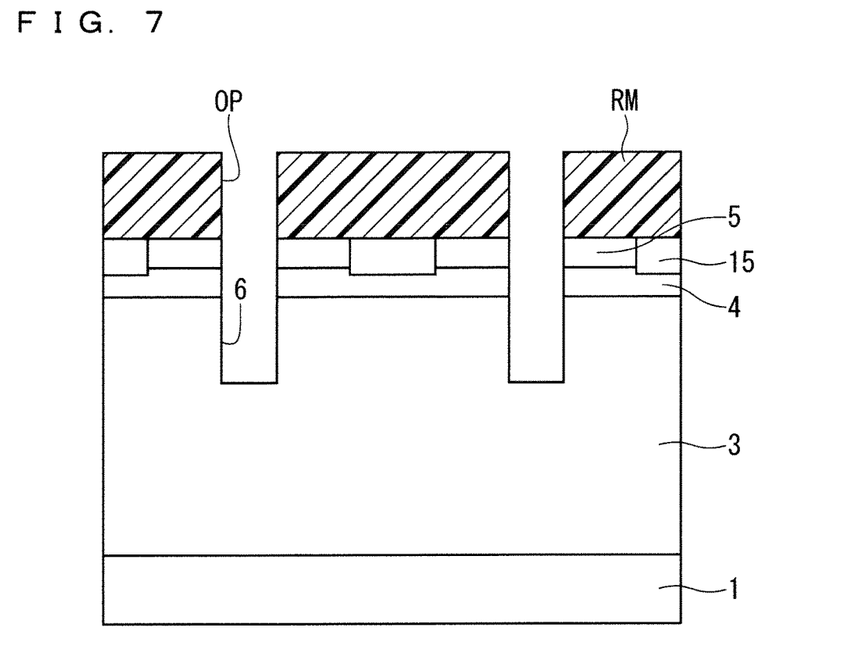

Next, in the step illustrated in FIG. 7, an etching mask RM having opening portions OP at portions corresponding to the formation regions of the gate trenches 6 is formed on the epitaxial layer 3 on which the source region 5 and the well contact region 15 are formed by using a resist material. And, the gate trench 6 penetrating through the source region 5 and the well region 4 in the thickness direction and reaching the inside of the epitaxial layer 3 is formed through an etching mask RM by, for example, reactive ion etching (RIE) method. Thereafter, by using the etching mask RM as an ion implantation mask, ion implantation of p-type impurities is performed from above to form the p-type protective diffusion layer 13 under the bottom surface of the gate trench 6. At this time, the protective diffusion layer 13 is formed to be in the range of $1\times10^{17}$ cm$^{-3}$ to $1\times10^{19}$ cm$^{-3}$, for example, $5\times10^{18}$ cm$^{-3}$.

Figure 8:
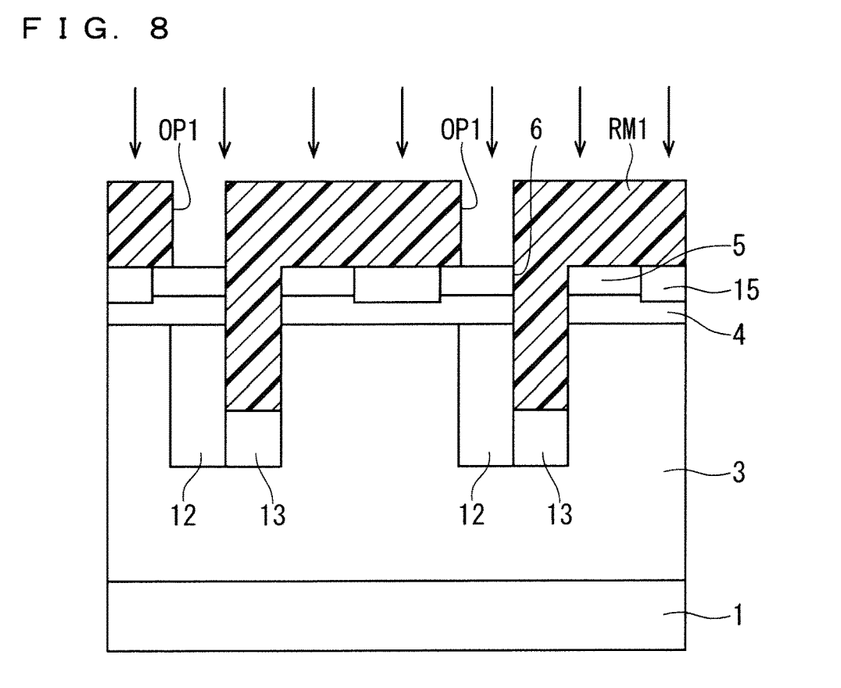

After removing the etching mask RM, next, in the step illustrated in FIG. 8, an ion implantation mask RM1 is formed using a resist material. The ion implantation mask RM1 has a pattern in which the region corresponding to the side surface on the side of the gate trench 6 where the well connection layer 12 is provided and the vicinity thereof is the opening OP1. The p-type well connection layer 12 in contact with the side surface of the gate trench 6 and the side surface of the protective diffusion layer 13 is formed by ion implantation of p-type impurities from above through the ion implantation mask RM1. At this time, the well connection layer 12 is formed to be in the range of $1\times10^{17}$ cm$^{-3}$ to $1\times10^{19}$ cm$^{-3}$, for example, $5\times10^{18}$ cm$^{-3}$.

Figure 9:
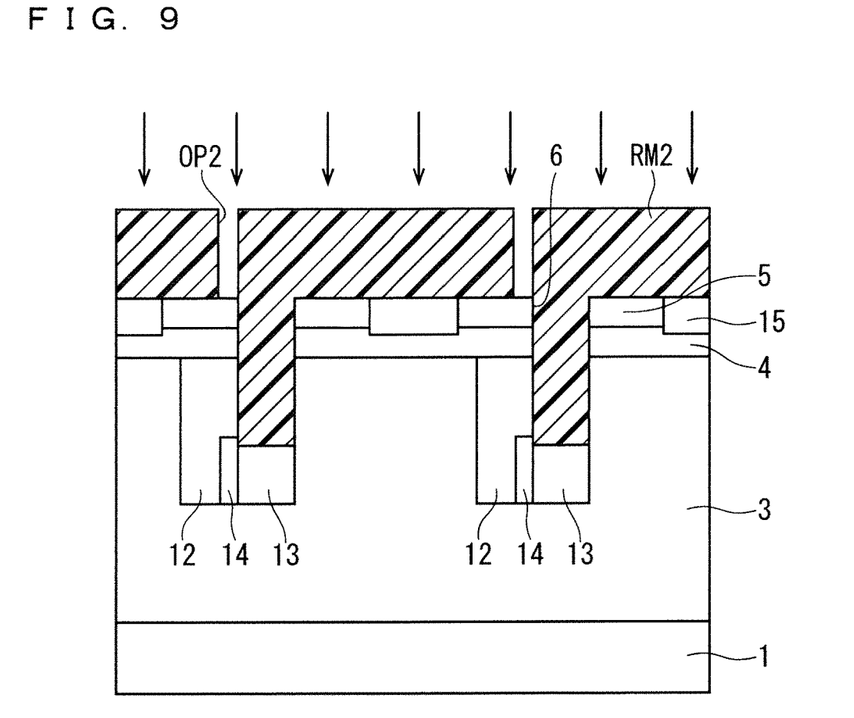

After removing the etching mask RM, next, in the step illustrated in FIG. 9, an ion implantation mask RM2 is formed using a resist material. The ion implantation mask RM2 has a pattern in which the region corresponding to the side surface on the side of the gate trench 6 where the isolation diffusion layer 14 is provided and the vicinity thereof is the opening OP2. The isolation diffusion layer 14 in contact with the side surface in the vicinity of the bottom surface of the gate trench 6 and the side surface of the protective diffusion layer 13 is formed by ion implantation of n-type impurities from above through the ion implantation mask RM2. In order to form the n-type isolation diffusion layer 14 in the lower layer portion of the p-type well connection layer 12, the influence of the p-type impurities is canceled so that the n-type substantial impurity concentration falls in the range of $5\times10^{15}$ cm$^{-3}$ to $5\times10^{16}$ cm$^{-3}$. It should be noted that, the impurity concentration of the isolation diffusion layer 14 is set so as to, in the above range, depending on the specification of the breakdown voltage of the MOSFET 100, satisfy the condition that the protective diffusion layer 13 is in a floating state when the MOSFET 100 is the ON state and is grounded when the MOSFET 100 is OFF. Although it is desirable that the impurity concentration of the isolation diffusion layer 14 is lower than the impurity concentration of the epitaxial layer 3, the impurity concentration of the isolation diffusion layer 14 is set by giving priority to satisfying the above-mentioned conditions.

In the above description, the example in which the well connection layer 12 is formed after the protective diffusion layer 13 is formed and then the isolation diffusion layer 14 is formed, the formation order of the layers is not limited to the above.

In the above description, the example in which the protective diffusion layer 13, the well connection layer 12 and the isolation diffusion layer 14 are formed after the gate trench 6 is formed has been described. However, the protective diffusion layer 13, the well connection layer 12 and the isolation diffusion layer 14 may be formed before the gate trench 6 is formed, and the gate trench 6 may be formed in accordance with the formation positions of these layers.

Figure 10:
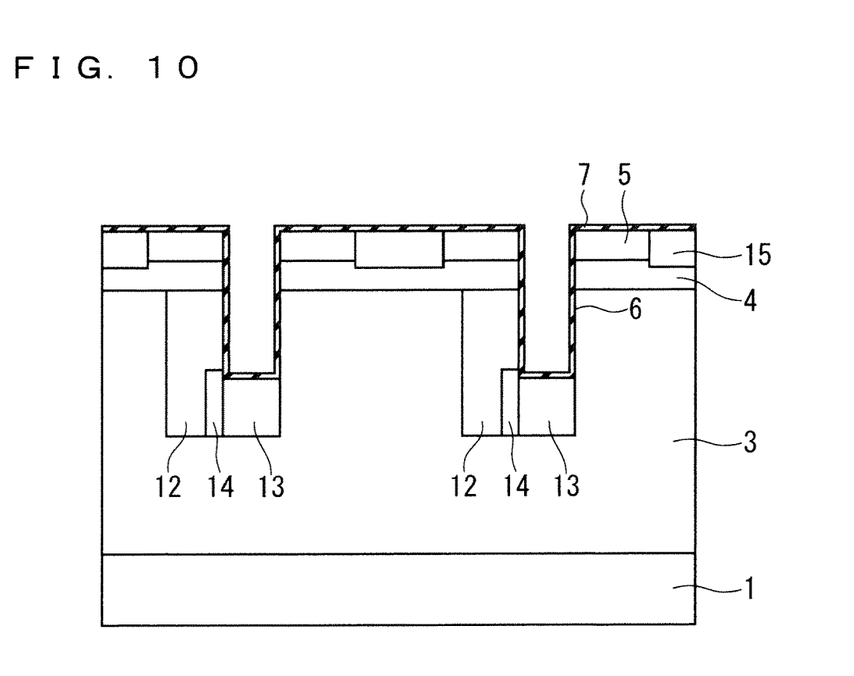

Next, in the step illustrated in FIG. 10, after removing the ion implantation mask RM2, the gate insulating film 7 is formed so as to cover at least the inner wall surface of the gate trench 6 and the periphery of the gate trench 6, by a chemical vapor deposition (CVD) method and so forth.

Figure 11:
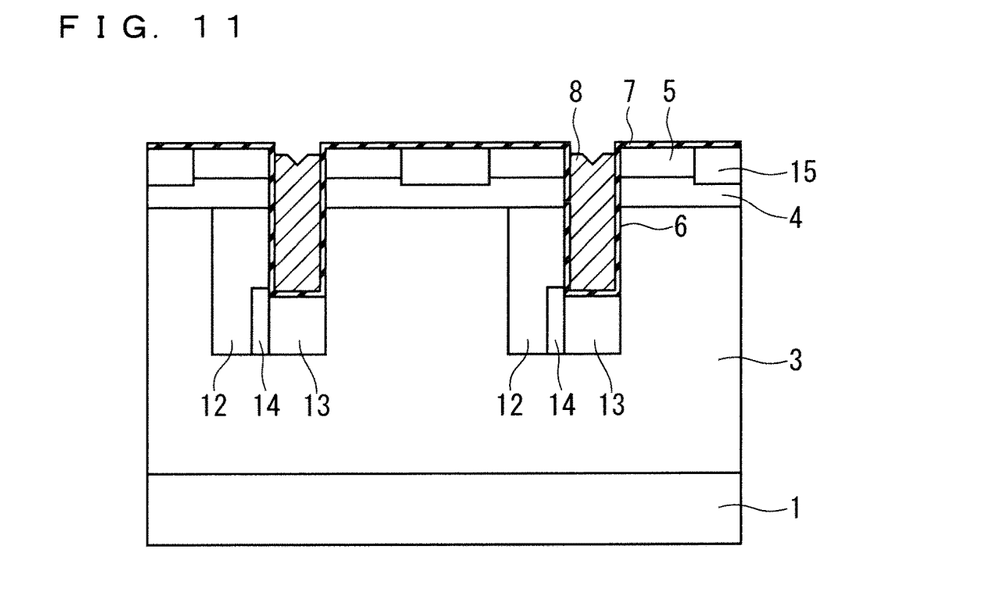

Next, a conductor layer such as polysilicon containing impurities at a relatively high concentration is formed, by the CVD method, on the epitaxial layer 3 on which the gate insulating film 7 is formed, in the gate trench 6 in which the inner wall surface is covered with the gate insulating film 7, the conductor layer is embedded, and then, the conductor layer on the epitaxial layer 3 is removed by etching, thereby obtaining a structure in which the gate electrode 8 is embedded in the gate trench 6 as illustrated in FIG. 11.

Figure 12:
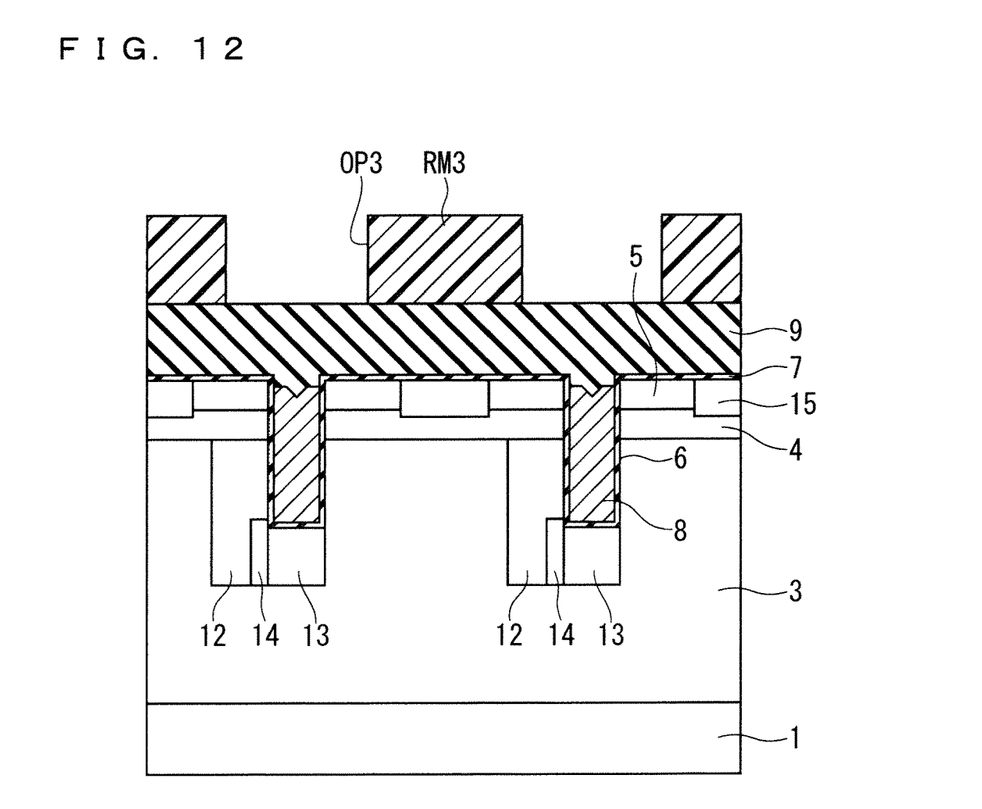
Figure 13:
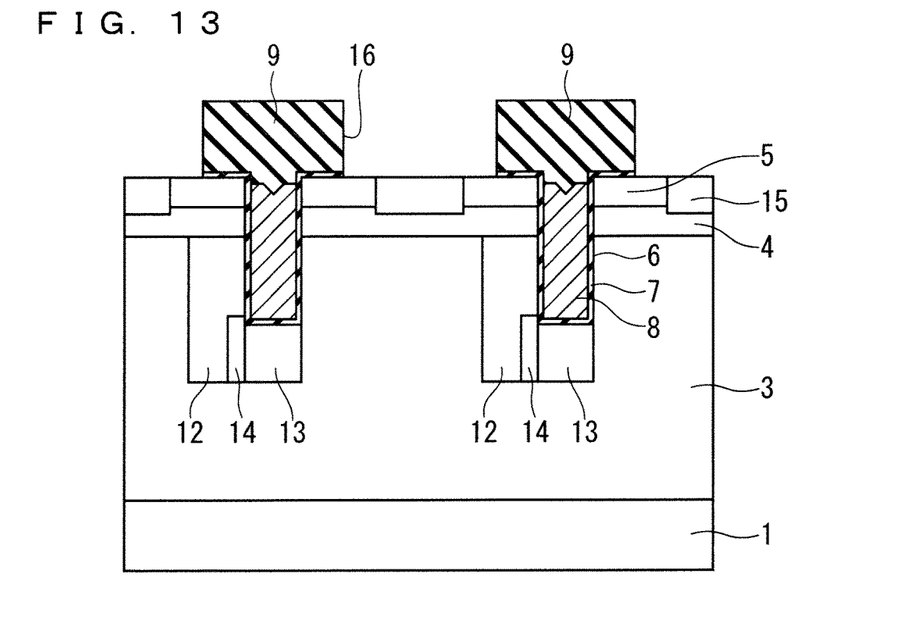

Next, in the step illustrated in FIG. 12, after the interlayer insulating film 9 is formed on the substrate including the gate trench 6 by a thermal oxidation method, the CVD method, and so forth, on the interlayer insulating film 9, an etching mask RM3 having an opening portion OP3 in a portion corresponding to the formation region of the source contact 16 is patterned using a resist material. Then, the interlayer insulating film 9 is removed by dry etching and so forth via the etching mask RM3, thereby forming the source contact 16 penetrating through the interlayer insulating film 9 and reaching on the epitaxial layer 3 as illustrated in FIG. 13. At that time, the unnecessary gate insulating film 7 along with the interlayer insulating film 9 are also removed.

Next, a metal film made of metal such as nickel is formed by sputtering or the like so as to cover the surface of the interlayer insulating film 9 and on the substrate between the interlayer insulating films 9. Thereafter, an annealing treatment is performed to form a silicide film 17 (FIG. 1) on the surface of the interlayer insulating film 9 and on the substrate between the interlayer insulating films 9 by forming a metal silicide film (here, $NiSi_2$ film). Thereafter, a source electrode 10 is formed by sputtering and so forth so as to embed the source contact 16, and finally the drain electrode 11 is formed on the other main surface (second main surface) of the silicon carbide semiconductor substrate 1 by the sputtering method and so forth, thereby obtaining the MOSFET 100 illustrated in FIG. 1.

It should be noted that, known ion implantation techniques can be employed for forming the impurity layer and the impurity region of the MOSFET 100 described above, therefore, the implantation energy and the dose can be appropriately set by those skilled in the art, hence the explanation is omitted.

Embodiment 2

<Device Configuration>

Figure 14:
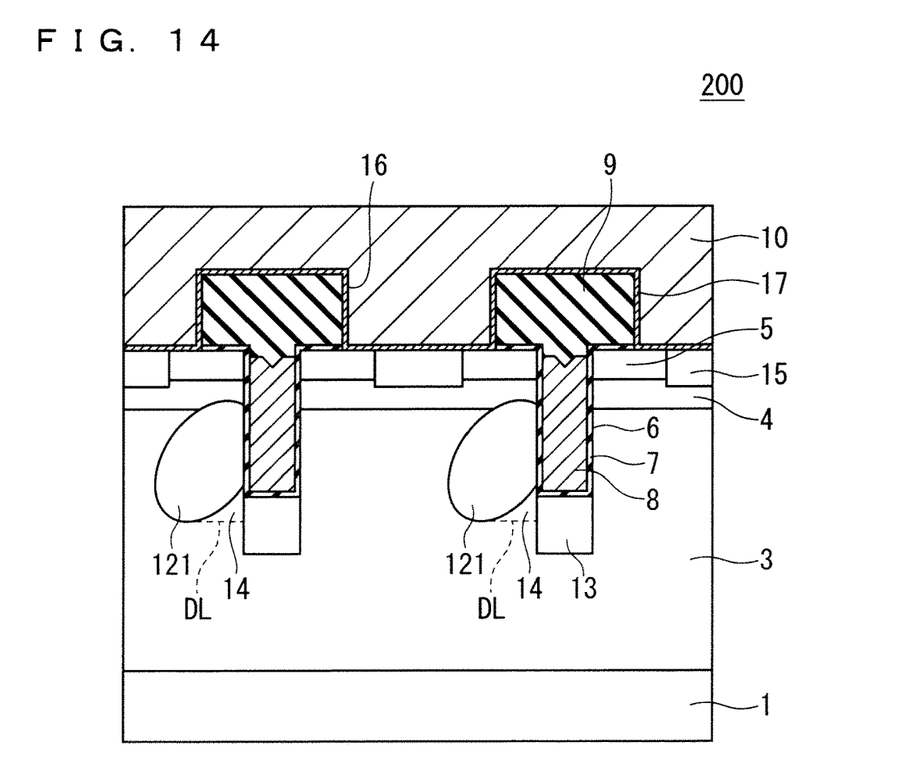
FIG. 14 is a cross-sectional view illustrating a configuration of a semiconductor device of Embodiment 2 according to the present invention.

FIG. 14 is a cross-sectional view illustrating a configuration of characteristic parts of a trench gate type MOSFET 200 according to Embodiment 2 of the present invention, and corresponds to the sectional view taken along the line A-A in FIG. 1 as seen in the direction of the arrows. It should be noted that, in FIG. 14, the same components as those of the MOSFET 100 described with reference to FIG. 1 are denoted by the same reference numerals, and overlapping descriptions are omitted.

As illustrated in FIG. 14, in the MOSFET 200 of Embodiment 2, a well connection layer 121 of the second conductivity type provided so as to be in contact with one side surface of the gate trench 6 has an elliptic contour, the arrangement thereof is that an ellipse is in contact with one side surface of the gate trench 6 with the ellipse being tilted obliquely with respect to the gate trench 6. The upper part of the elliptic well connection layer 121 is connected to the well region 4 so as to enter from the bottom surface of the well region 4 into the inside of the well region 4 and the lower part of the well connection layer 121 extends to a position deeper than the bottom surface of the gate trench 6 in the oblique direction with respect to one side surface of the gate trench 6. In other words, the isolation diffusion layer 14 is interposed between the side surface of the protective diffusion layer 13, which is on the same side as the one side surface of the gate trench 6 and the well connection layer 121. That is, the epitaxial layer 3 is interposed in the region defined by the broken line DL and the edge of the well connection layer 121 in FIG. 14, and the structure is that the well connection layer 121 are not in direct contact with the protective diffusion layer 13.

The epitaxial layer 3 interposed between the protective diffusion layer 13 and the well connection layer 121 functions as an isolation diffusion layer and sets the protective diffusion layer 13 in a floating state when the MOSFET 200 is in the ON state, therefore, the width of the JFET region formed in the region sandwiched between the depletion layers each of which extends from the protective layers 13 and the well connection layers 121 provided to the adjacent gate trenches 6 is widened, the JFET resistance is lowered, thereby suppressing an increase in on-resistance.

Meanwhile, when the MOSFET 200 is in the OFF state, the depletion layers extending from each of the well connection layer 121 and the protective layer 13 turn into the punch-through state. and, the potential of the protective diffusion layer 13 becomes the same potential as that of the well connection layer 121, that is, the same ground potential as that of the well region 4 by punch-through, and the potential between the protective diffusion layer 13 and vicinity thereof is doubled compared to the case where the protective layer 13 is in the floating state. As a result, the depletion layer for protecting the gate insulating film 7 at the bottom of the gate trench 6 stretches further, so that the gate insulating film 7 can be protected.

<Manufacturing Method>

Hereinafter, a method of manufacturing the MOSFET 200 of Embodiment 2 will be described with reference to FIG. 15. First, the gate trench 6 penetrating through the source region 5 and the well region 4 in the thickness direction and reaching the inside of the epitaxial layer 3 is formed through the processes described with reference to FIGS. 5 to 7. Thereafter, by using the etching mask RM illustrated in FIG. 7 as an ion implantation mask, ion implantation of p-type impurity is performed from above to form the p-type protective diffusion layer 13 under the bottom surface of the gate trench 6.

Figure 15:
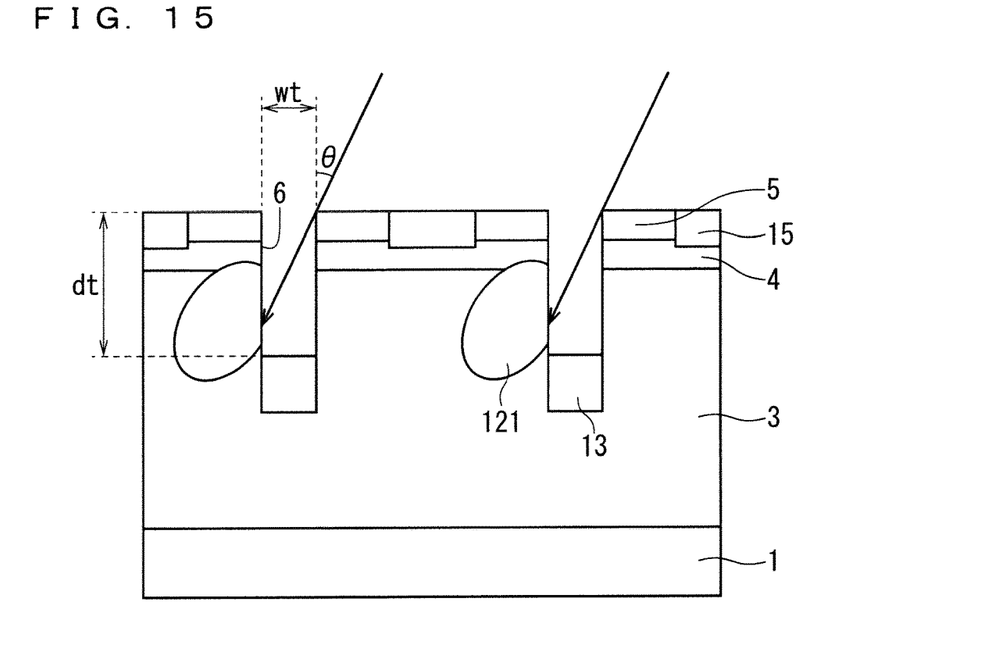
FIG. 15 is a cross-sectional view illustrating a manufacturing process of the semiconductor device of Embodiment 2 according to the present invention.

After removing the etching mask RM, in the step illustrated in FIG. 15, the well connection layer 121 in contact with the side surface of the gate trench 6 is formed by ion implantation of a p-type impurity such as Al from oblique direction with respect to the side surface of the gate trench 6.

In the ion implantation, as illustrated in FIG. 15, the angle (θ) of ion implantation with respect to the side surface of the gate trench 6 is set to satisfy the relationship θ≤wt/dt where (dt) is the trench depth and (wt) is the trench width.

By setting the angle (θ) of ion implantation to the above value, the epitaxial layer 3 can be interposed between the protective diffusion layer 13 and the well connection layer 121, and the region defined by the broken line DL and the edge of the well connection layer 121 in FIG. 14 can be practically referred to as the isolation diffusion layer 14.

Accordingly, by ion implantation from oblique direction with respect to the side surface of the gate trench 6 to form the well connection layer 121, the isolation diffusion layer 14 can be simultaneously formed, simplification of manufacturing process of the MOSFET 200 is ensured, and the increase in manufacturing cost by providing the isolation diffusion layer 14 can be suppressed.

Although the order of forming the protective diffusion layer 13 and the well connection layer 121 is not limited to the above, in the case of forming the protective diffusion layer 13 previously, the etching mask used at the time of forming the gate trench 6 can be used as an ion implantation mask, therefore the manufacturing process can be simplified.

Subsequently, the gate insulating film 7 (FIG. 14) is formed so as to cover at least the inner wall surface of the gate trench 6 and the periphery of the gate trench 6 by the thermal oxidation method, the CVD method and so forth.

Next, a conductor layer such as polysilicon containing impurities at a relatively high concentration is formed, by the CVD method, on the epitaxial layer 3 on which the gate insulating film 7 is formed, in the gate trench 6 in which the inner wall surface is covered with the gate insulating film 7, the conductor layer is embedded, and then, the conductor layer on the epitaxial layer 3 is removed by etching, thereby obtaining a structure in which the gate electrode 8 (FIG. 14) is embedded in the gate trench 6.

Next, the interlayer insulating film 9 (FIG. 14) is formed on the substrate including the gate trench 6 by the thermal oxidation method, the CVD method, and so forth, thereafter, the interlayer insulating film 9 is removed by dry etching and so forth using an etching mask having an opening in a portion corresponding to the formation region of the source contact 16 (FIG. 14), thereby forming the source contact 16 penetrating through the interlayer insulating film 9 and reaching on the epitaxial layer 3.

In the following, a silicide film 17 (FIG. 14) is formed on the surface of the interlayer insulating film 9 and on the substrate between the interlayer insulating films 9 by forming a metal silicide film (here, $NiSi_2$ film), thereafter, a source electrode 10 is formed by sputtering and so forth so as to embed the source contact 16, and finally the drain electrode 11 is formed on the other main surface (second main surface) of the silicon carbide semiconductor substrate 1 by the sputtering method and so forth, thereby obtaining the MOSFET 200 illustrated in FIG. 14.

In the silicon carbide semiconductor device, it is known that the number of electron traps generated at the MOS interface between the gate insulating film 7 and the epitaxial layer 3 which is the silicon carbide layer is larger than that of the Si semiconductor device, and the reliability of the MOS interface and the gate insulating film 7 is lower than that of the Si semiconductor device. Therefore, the effect of applying Embodiments 1 and 2 that can relieve the electric field applied to the gate insulating film 7 in the OFF state is remarkable. It should be noted that, in the above description, MOSFETs are described as an example, however a well connection layer, a protective diffusion layer and an isolation diffusion layer may be provided in an Insulated Gate Bipolar Transistor (IGBT).

Embodiment 3

In Embodiment 3, the semiconductor devices according to the above-described Embodiments 1 and 2 are applied to a power conversion apparatus. Although the present invention is not limited to a specific power conversion apparatus, hereinafter, the case where the present invention is applied to a three-phase inverter will be described as Embodiment 3.

Figure 16:
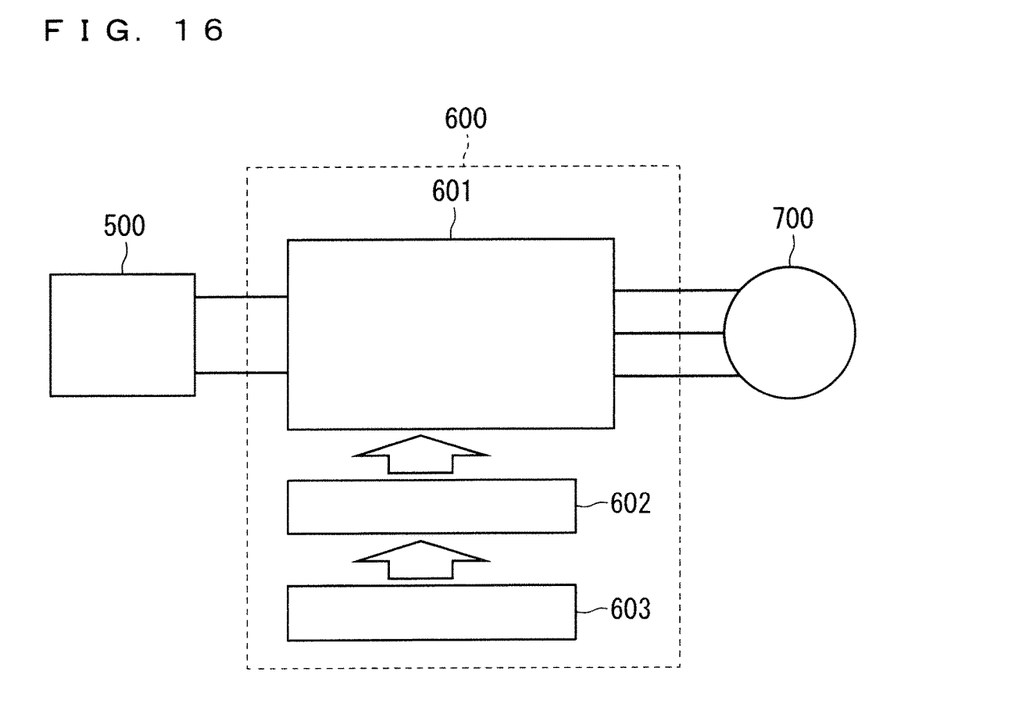
FIG. 16 is a block diagram illustrating a configuration of a power conversion system to which a power conversion apparatus according to Embodiment 3 of the present invention is applied.

FIG. 16 is a block diagram illustrating a configuration of a power conversion system to which a power conversion apparatus according to Embodiment 3 is applied.

The power conversion system illustrated in FIG. 16 includes a power source 500, a power conversion apparatus 600, and a load 700. The power source 500 is a DC power source and supplies DC power to the power conversion apparatus 600. The power source 500 can be various types, such as a DC system, a solar cell, a storage battery, alternatively, the power source 500 may include a rectifier circuit or an AC/DC converter connected to an AC system. Further, the power source 500 may be constituted by a DC/DC converter that converts DC power output from the DC system into predetermined electric power.

The power conversion apparatus 600 is a three-phase inverter connected to the power source 500 and the load 700, and converts DC power supplied from the power source 500 into AC power then supplies the AC power to the load 700. As illustrated in FIG. 16, the power conversion apparatus 600 includes a main conversion circuit 601 for converting DC power into AC power and outputting the AC power, a driving circuit 602 for outputting a driving signal for driving each switching element of the main conversion circuit 601, and a control circuit 603 for outputting a control signal for controlling the driving circuit 602 to the driving circuit 602.

The load 700 is a three-phase motor driven by AC power supplied from the power conversion apparatus 600. It should be noted that, the load 700 is not limited to a specific use, and is a motor mounted in various electric apparatuses, for example, the load 700 is used as a motor for hybrid vehicles, electric vehicles, railway vehicles, elevators, or air conditioning apparatuses.

Hereinafter, details of the power conversion apparatus 600 will be described. The main conversion circuit 601 includes a switching device and a freewheel diode (not illustrated), the switching device converts DC power supplied from the power source 500 into AC power by performing switching and supplies thereof to the load 700. There are various specific circuit configurations of the main conversion circuit 601, and the main conversion circuit 601 according to Embodiment 3 is a two-level three-phase full-bridge circuit which can be composed of six switching devices and six freewheel diodes each of which is connected in reversely parallel to the respective switching devices. For each switching device of the main conversion circuit 601, the semiconductor device according to any one of Embodiments 1 and 2 described above is applied. In the six switching devices, for each pair of switching devices, an upper arm and a lower arm are formed by connecting the switching devices in series, and each pair of upper arm and lower arm constitutes each phase (U-phase, V-phase, W-phase) of the full bridge circuit. And, an output terminal of each pair of upper arm and lower arm, that is, three output terminals of the main conversion circuit 601 are connected to the load 700.

The driving circuit 602 generates the driving signal for driving each switching device of the main conversion circuit 601 and supplies thereof to a control electrode of the switching device of the main conversion circuit 601. Specifically, in accordance with the control signal from the control circuit 603 which will be described later, the driving circuit 602 outputs a driving signal for turning each switching device to the ON state and a driving signal for turning each switching device to the OFF state to the control electrode of each switching device. When the switching devices are maintained to be in the ON state, the driving signal is a voltage signal (ON signal) equal to or higher than a threshold voltage of the switching devices and when the switching devices are maintained to be in the OFF state, the driving signal is a voltage signal (OFF signal) lower than the threshold voltage of the switching devices.

The control circuit 603 controls the switching devices of the main conversion circuit 601 so that desired power is supplied to the load 700. Specifically, the control circuit 603 calculates the time (ON time) that each switching device of the main conversion circuit 601 should be in the ON state based on the power to be supplied to the load 700. For example, the main conversion circuit 601 can be controlled by PWM control for modulating the ON time of the switching device according to the voltage to be output. Then, a control command (control signal) is output to the driving circuit 602 so that an ON signal is output to the switching devices to be ON state and an OFF signal is output to the switching devices to be OFF state at each point of time. In accordance with the control signal, the driving circuit 602 outputs the ON signal or the OFF signal as the driving signal to the control electrode of each switching device.

In the power conversion apparatus according to Embodiment 3, the semiconductor device according to one of Embodiments 1 and 2 is applied as the switching devices of the main conversion circuit 601, therefore, when the switching devices are in the ON state, the width of the JFET region formed in the region sandwiched between the depletion layers each of which extends from the protective layers 13 and the well connection layers 12 provided to the adjacent gate trenches 6 is widened, the JFET resistance is lowered, thereby suppressing an increase in on-resistance. And, when the switching devices are in the OFF state, the depletion layers each extending from the protective layers 13 and the well connection layers 12 provided to the adjacent gate trenches 6 turn into the punch-through state, and the potential between the protective diffusion layer 13 and vicinity thereof is doubled compared to the case where the protective layer 13 is in the floating state. As a result, the depletion layer for protecting the gate insulating film 7 at the bottom of the gate trench 6 stretches further, so that the gate insulating film 7 can be protected.

In Embodiment 3, an example in which the present invention is applied to a two-level three-phase inverter has been described, however, the present invention is not limited to this and can be applied to various power conversion apparatuses. In Embodiment 3, although a two-level power conversion apparatus is applied, however, a three-level or multi-level power conversion apparatus may be applied, and when supplying power to a single-phase load, the present invention is applied to a single-phase inverter may be applied. In the case where power is supplied to a direct current load and so forth, the present invention can also be applied to a DC/DC converter or an AC/DC converter.

In addition, the power conversion apparatus to which the present invention is applied is not limited to the case where the above-described load is an electric motor, and may be applied to, for example, power source equipment of an electric discharge machine, a laser processing machine, an induction heating cooker or a non-contact power supply system, and further, can also be used as a power conditioner for a photovoltaic power generation system or a power storage system, for example.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a first semiconductor layer of a first conductivity type;
a first semiconductor region of a second conductivity type provided in an upper layer part of the first semiconductor layer;
a second semiconductor region of the first conductivity type provided in the upper layer part of the first semiconductor layer;
a gate trench provided so as to penetrate through the first and second semiconductor regions in a thickness direction and a bottom surface thereof reaching inside of the first semiconductor layer;
a gate insulating film covering an inner wall surface of the gate trench;
a gate electrode embedded in the gate trench;
a second semiconductor layer of the second conductivity type provided so as to extend, from the bottom surface of the gate trench, in a thickness direction of the first semiconductor layer;
a third semiconductor layer of the second conductivity type extending to a position deeper than the bottom surface of the gate trench; and
a fourth semiconductor layer of the first conductivity type interposed between the second semiconductor layer and the third semiconductor layer in the position deeper than the bottom surface of the gate trench.

2. The semiconductor device according to claim 1, wherein
the fourth semiconductor layer having a given width extends along the side surface of the second semiconductor layer, and is provided so as to cover at least the side surface of the second semiconductor layer.

3. The semiconductor device according to claim 2, wherein
a width of the fourth semiconductor layer is 0.1 µm to 0.3 µm.

4. The semiconductor device according to claim 1, wherein
the fourth semiconductor layer has a same impurity concentration as that of the first semiconductor layer or a lower impurity concentration than that of the first semiconductor layer.

5. The semiconductor device according to claim 1, wherein the third semiconductor layer has an elliptic contour, is arranged such that an ellipse is in contact with one side surface of the gate trench with the ellipse being tilted obliquely with respect to the one side surface of the gate trench, and in which a lower part thereof extends to a position deeper than the bottom surface of the gate trench in an oblique direction with respect to the one side surface of the gate trench, and
wherein the fourth semiconductor layer is composed of the first semiconductor layer interposed between the side surface of the second semiconductor layer and a surface of the lower part of the third semiconductor layer.

6. The semiconductor device according to claim 1, wherein
the first semiconductor layer includes a silicon carbide layer.

7. A method of manufacturing the semiconductor device according to claim 5, the method comprising the steps of:
(a) after the trench is formed, forming the second semiconductor layer extending from the bottom surface of the gate trench, in a thickness direction of the first semiconductor layer by ion implanting impurities of the second conductive type from above the gate trench; and
(b) forming the third semiconductor layer by ion implanting impurities of the second conductive type from oblique direction with respect to the one side surface of the gate trench,
the step (b) including a step of setting an angle (θ) of ion implantation with respect to the side surface of the gate trench to satisfy a relationship θ≤wt/dt where (dt) is a trench depth and (wt) is a trench width.

8. A power conversion apparatus, comprising:
a main conversion circuit including the semiconductor device according to claim 1, and configured to convert and output power to be input;
a driving circuit configured to output a driving signal for driving the semiconductor device to the semiconductor device; and a control circuit configured to output a control signal for controlling the driving circuit to the driving circuit.

\* \* \* \* \*